United States Patent
Cho et al.

(10) Patent No.: US 9,112,070 B2
(45) Date of Patent: Aug. 18, 2015

(54) SOLAR CELL AND METHOD OF MANUFACTURING THE SAME

(71) Applicant: Shinshung Solar Energy Co., Ltd., Seongnam-si (KR)

(72) Inventors: Young Hyun Cho, Chungcheongbuk-do (KR); Ji Sun Kim, Incheon (KR); Eun Joo Lee, Seoul (KR); Jong Youb Lim, Chungcheongbuk-do (KR)

(73) Assignee: Shinshung Solar Energy Co., Ltd., Seongnam-si (KR)

( * ) Notice: Subject to any disclaimer, the term of this patent is extended or adjusted under 35 U.S.C. 154(b) by 0 days.

(21) Appl. No.: 13/932,516

(22) Filed: Jul. 1, 2013

(65) Prior Publication Data
US 2014/0158188 A1   Jun. 12, 2014

(30) Foreign Application Priority Data
Jun. 29, 2012   (KR) .......................... 10-2012-0071206

(51) Int. Cl.
| | |
|---|---|
| H01L 31/065 | (2012.01) |
| H01L 31/0224 | (2006.01) |
| H01L 31/068 | (2012.01) |
| H01L 31/18 | (2006.01) |

(52) U.S. Cl.
CPC .... *H01L 31/022425* (2013.01); *H01L 31/0684* (2013.01); *H01L 31/1804* (2013.01); *Y02E 10/52* (2013.01)

(58) Field of Classification Search
CPC ............ H01L 31/1804; H01L 31/0684; H01L 31/022425

USPC .............................. 136/256, 255, 252; 438/72
See application file for complete search history.

(56) References Cited

U.S. PATENT DOCUMENTS

| | | | | |
|---|---|---|---|---|
| 4,610,077 | A * | 9/1986 | Minahan et al. ................. | 438/68 |
| 4,838,952 | A * | 6/1989 | Dill et al. ....................... | 136/256 |
| 5,017,243 | A * | 5/1991 | Otsubo .......................... | 136/244 |
| 2003/0089393 | A1* | 5/2003 | Fath et al. ...................... | 136/256 |
| 2004/0261839 | A1* | 12/2004 | Gee et al. ...................... | 136/256 |
| 2005/0176164 | A1* | 8/2005 | Gee et al. ........................ | 438/48 |
| 2007/0235075 | A1* | 10/2007 | Park .............................. | 136/252 |
| 2008/0099871 | A1* | 5/2008 | Bui et al. ....................... | 257/461 |
| 2010/0218818 | A1* | 9/2010 | Kang et al. .................... | 136/256 |

* cited by examiner

*Primary Examiner* — Golam Mowla
(74) *Attorney, Agent, or Firm* — The Webb Law Firm

(57) ABSTRACT

A solar cell and a method of manufacturing the same are disclosed.

The solar cell includes a semiconductor substrate doped with a first conductive type impurity through which a via hole passing from a first surface of the semiconductor substrate to a second surface thereof facing the first surface is formed, wherein the first surface is a light receiving surface, upper and lower emitter layers respectively formed on upper and lower surfaces of the semiconductor substrate and doped with a second conductive type impurity that is different from the first conductive type impurity, current collecting layers formed on sidewalls of the via hole and doped with a higher concentration of the first conductive type impurity than that of the semiconductor substrate, a contact electrode extending from the first surface of the semiconductor substrate to the second surface thereof so as to fill the via hole, and upper and lower electrodes respectively contacting the upper and lower emitter layers.

3 Claims, 3 Drawing Sheets

SOLAR CELL AND METHOD OF MANUFACTURING THE SAME

BACKGROUND OF THE INVENTION

1. Field of the Invention

The present invention relates to a solar cell and a method of manufacturing the same, and more particularly to a bifacial solar cell and a method of manufacturing the same.

2. Description of the Related Art

Recently, interest in alternative energy sources that can replace existing energy sources such as petroleum or coals has increased due to depletion of existing energy sources. Among these alternative energy sources, solar cells are receiving attention because solar energy is abundant and solar cells do not cause problems in terms of environmental pollution. Solar cells are classified into solar thermal cells to generate steam needed for rotation of a turbine using solar heat and photovoltaic solar cells that use semiconductors to convert photons into electrical energy. Photovoltaic solar cells are generally referred to as "solar cells" (hereinafter referred to as "solar cells").

Solar cells are semiconductor elements that convert sunlight into electrical energy and have a p-n junction structure, and basic structures thereof are the same as those of diodes.

When light is incident on a solar cell, the solar cell absorbs the incident light and thus interaction between the incident light and a material constituting a semiconductor of the solar cell occurs. As a result, electrons and holes, which are minority carriers, are formed, and the electrons and holes move towards corresponding electrodes connected to each other to obtain electromotive force. This process is referred to as the photovoltaic effect.

Meanwhile, bifacial solar cells produce electricity such that sunlight is absorbed by both front and rear surfaces of the solar cell. While a general solar cell produces electricity as a front surface thereof absorbs sunlight, a bifacial solar cell absorbs sunlight from both front and rear surfaces thereof and thus current formed is higher than a general solar cell, which results in production of a greater amount of electricity.

When a conventional bifacial solar cell includes a p-type substrate, an n-layer is formed on a front surface of the p-type substrate and a p-layer is formed on a rear surface thereof.

However, when a bifacial solar cell is formed using such conventional manufacturing method, energy conversion efficiencies at front and rear surfaces thereof differ, and the energy conversion efficiency of the rear surface thereof is generally lower (i.e., approximately 2%) than that of the front surface of the solar cell.

SUMMARY OF THE INVENTION

Therefore, the present invention has been made in view of the above problems, and it is an object of the present invention to provide a solar cell and a method of manufacturing the same that may substantially address one or more problems caused by limitations and disadvantages of the related art.

It is another object of the present invention to provide a solar cell and a method of manufacturing the same that may address problems of a bifacial solar cell, i.e., lower photoelectric conversion efficiency at a rear surface than at a front surface.

In accordance with the present invention, the above and other objects can be accomplished by the provision of a solar cell including a semiconductor substrate doped with a first conductive type impurity through which a via hole passing from a first surface of the semiconductor substrate to a second surface thereof facing the first surface is formed, wherein the first surface is a light receiving surface, upper and lower emitter layers respectively formed on upper and lower surfaces of the semiconductor substrate and doped with a second conductive type impurity that is different from the first conductive type impurity, current collecting layers formed on sidewalls of the via hole and doped with a higher concentration of the first conductive type impurity than that of the semiconductor substrate, a contact electrode extending from the first surface of the semiconductor substrate to the second surface thereof so as to fill the via hole, and upper and lower electrodes respectively contacting the upper and lower emitter layers.

The solar cell may further include upper and lower anti-reflection coatings formed on the upper and lower emitter layers, respectively.

The upper and lower anti-reflection coatings each may include a plurality of layers with different indexes of refraction.

It is another object of the present invention to provide a method of manufacturing a solar cell, the method including forming, on a semiconductor substrate of a first conductive type, upper and lower emitter layers doped with an impurity of a second conductive type that is different from the first conductive type, forming upper and lower anti-reflection coatings on the upper and lower emitter layers, respectively, forming a via hole by sequentially etching the upper anti-reflection coating, the upper emitter layer, the semiconductor substrate, the lower emitter layer, and the lower anti-reflection coating, forming, on sidewalls of the via hole, current collecting layers doped with a higher concentration of an impurity of the first conductive type than that of the semiconductor substrate, partially exposing the upper and lower emitter layers by partially etching the upper and lower anti-reflection coatings, and forming electrodes in the via hole and on exposed portions of the upper and lower emitter layers.

The method may further include forming texturing by etching a surface of the semiconductor substrate.

The upper and lower anti-reflection coatings each may include a plurality of layers with different indexes of refraction.

The forming of the electrodes may be performed by depositing Ti or Ni into the via hole and performing an Al or Ag paste process thereon.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings.

When it is deemed that a detailed description of the related known functions or configurations may unnecessarily obscure the subject matter of the present invention, a detailed description thereof will be omitted. In addition, the following terms, which are defined in consideration of functions of the present invention, may be altered depending on user or operator intentions or judicial precedents. Therefore, the meaning of each term should be interpreted based on the overall disclosure of the specification.

Figure 1:
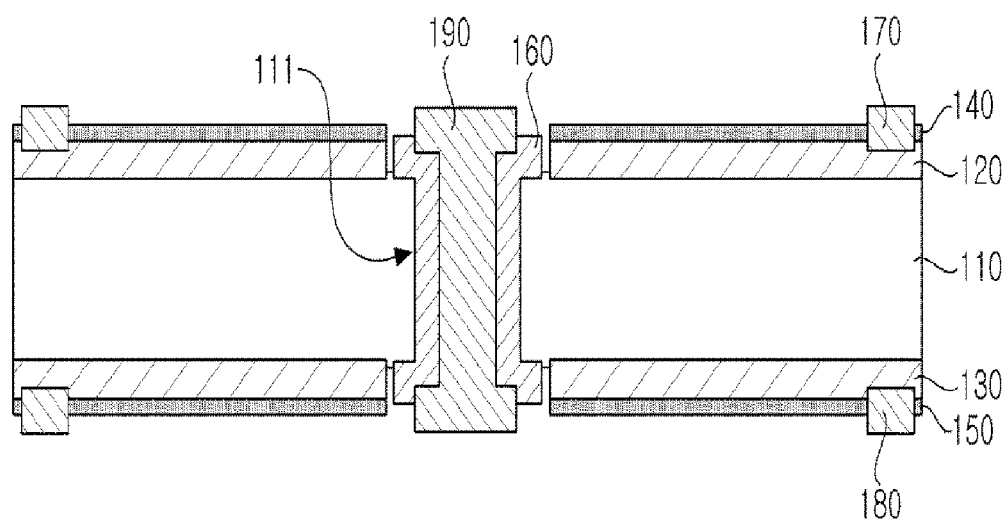
FIG. 1 is a sectional view illustrating a structure of a solar cell according to an embodiment of the present invention.

First, FIG. 1 is a sectional view illustrating a structure of a solar cell according to an embodiment of the present invention.

Referring to FIG. 1, the solar cell 100 according to the present embodiment includes a semiconductor substrate 110, upper and lower emitter layers 120 and 130, upper and lower anti-reflection coatings 140 and 150, current collecting layers 160, upper and lower electrodes 170 and 180, and a contact electrode 190.

The semiconductor substrate 110 may be, for example, a p-type silicon substrate doped with a first conductive type impurity at a low concentration and includes a via hole 111 that passes from a front surface of the semiconductor substrate 100 to a rear surface thereof. In this regard, any one of the first conductive type impurity and second conductive type impurity may be a p-type impurity, and the other thereof may be an n-type impurity.

As described above, the semiconductor substrate 110 may be a p-type substrate or an n-type substrate. However, a monocrystalline solar cell generally uses a p-type substrate due to rapid flow of free electrons. In the present embodiment, a p-type substrate is provided for illustrative purposes, and an n-type substrate may also be used.

In addition, texturing may be performed on a surface of the semiconductor substrate 110. Texturing is a process to form irregularities by etching a surface of a semiconductor substrate. An area of a light receiving surface is increased by such surface texturing and light reflectance at the surface of the semiconductor substrate is also reduced, whereby efficiency of the solar cell may be enhanced. In addition, the efficiency of the solar cell may be enhanced by appropriately adjusting a texturing direction and an inclined angle. The semiconductor substrate 110 has a textured structure and, accordingly, the upper and lower emitter layers 120 and 130 and the upper and lower anti-reflection coatings 140 and 150 also have a textured structure.

The upper and lower emitter layers 120 and 130 are respectively formed on upper (or front) and lower (or rear) surfaces of the semiconductor substrate 110 and are layers doped with a second conductive type impurity. By forming the upper and lower emitter layers 120 and 130 that are doped with the second conductive type impurity on the semiconductor substrate 110 doped with the first conductive type impurity, a PN junction of the solar cell is formed. For example, the semiconductor substrate 110 may be a p-type semiconductor, and the upper and lower emitter layers 120 and 130 may be an n-type semiconductor. In this regard, the semiconductor substrate 110 may include a plurality of n-type semiconductor layers or a plurality of p-type semiconductor layers. In another embodiment, the semiconductor substrate 110 may be an n-type semiconductor, and the upper and lower emitter layers 120 and 130 may be a p-type semiconductor.

The upper and lower anti-reflection coatings 140 and 150 are formed on an upper surface of the upper emitter layer 120 and a lower surface of the lower emitter layer 130, respectively, and suppress reflection of sunlight incident upon the semiconductor substrate 110, resulting in reduction in light reflectance of the solar cell 100 and thus improvement in the efficiency of the solar cell 100.

The upper and lower anti-reflection coatings 140 and 150 each may have a single-layered structure or a multi-layered structure. For example, each anti-reflection coating may include a plurality of layers with different indexes of refraction, wherein an index of refraction of an outer anti-reflection coating is lower than that of an inner anti-reflection coating.

In addition, an index of refraction of an innermost anti-reflection coating may be lower than that of the semiconductor substrate 110. That is, the index of refraction may be increased according to the order of incidence of sunlight from the outside, i.e., in this order of the outer anti-reflection coating, the inner anti-reflection coating, and the semiconductor substrate.

Due to changes in indexes of refraction of the upper and lower anti-reflection coatings 140 and 150, a direction in which sunlight incident from the outside proceeds is changed to a direction in which light reflectance may be reduced, whereby reflectance of the solar cell 100 may be reduced.

The current collecting layers 160 are respectively formed on sidewalls of the via hole 111 of the semiconductor substrate 110 and thus may reduce resistance to transfer of carriers, resulting in enhancement in charge collection efficiency. In addition, the current collecting layers 160 are layers (p+ type) doped with a high concentration of the first conductive type impurity that is the same as that doped on the semiconductor substrate 110.

The upper and lower electrodes 170 and 180 may be electrically connected to the upper emitter layer 120 and the lower emitter layer 130, respectively. Accordingly, the upper and lower electrodes 170 and 180 may collect one of the carriers generated by incident light, e.g., holes, and release the holes.

The contact electrode 190 is provided between the current collecting layers 160 formed on the respective sidewalls of the via hole 111 to fill the via hole 111.

Figure 2:
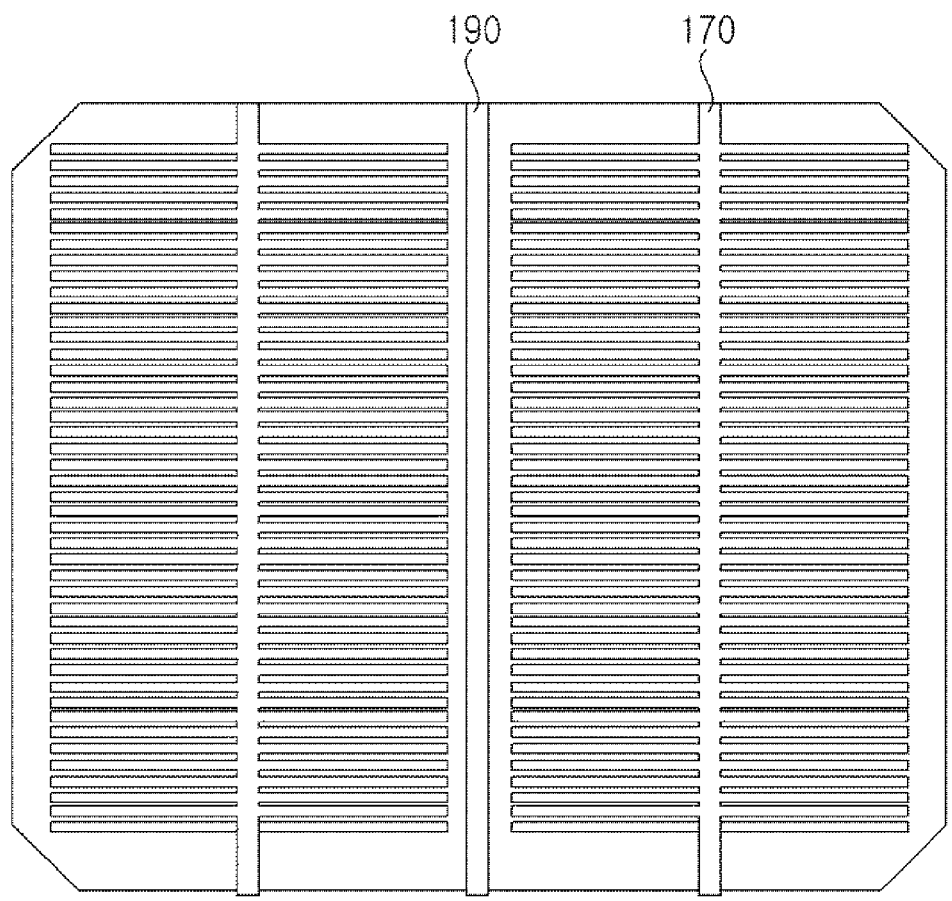
FIG. 2 is a plan view illustrating the structure of the solar cell according to an embodiment of the present invention.

That is, as illustrated in the plan view of FIG. 2, the solar cell 100 according to the present embodiment has a structure in which a p+ junction penetrating the semiconductor substrate 110 (p-type) is formed to attract holes, hole contact is formed between the upper and lower electrodes, and a junction collecting electrons in an n region is formed between finger electrodes at each of opposite sides of the p+ junction. In addition, the contact electrode 190 fills a central portion of the via hole 111 and thus serves as a guide for migration of holes.

Due to such configuration, the rear surface of the solar cell 100 has shallow n-type and p-type regions that are separately operable unlike a conventional bifacial solar cell which receives light from a rear surface thereof at which a p-n junction is formed. Thus, problems, i.e., lower photoelectric conversion efficiency in a rear surface of the conventional bifacial solar cell than in a front surface thereof may be addressed.

Figure 3:
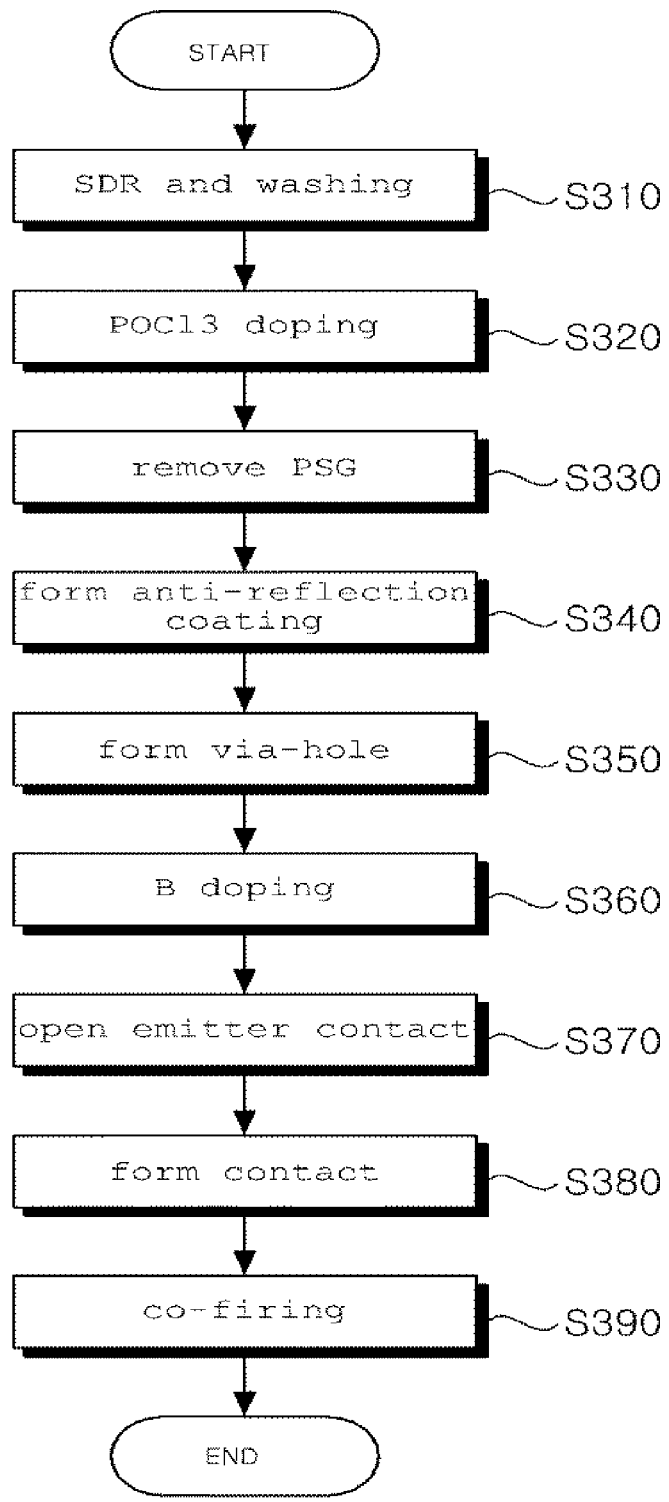
FIG. 3 is a flowchart for explaining a solar cell manufacturing method according to an embodiment of the present invention.

FIG. 3 is a flowchart for explaining a solar cell manufacturing method according to an embodiment of the present invention.

Referring to FIG. 3, first, saw damage removal (SDR) and a washing process are performed to remove defects, impurities and the like generated when cutting a wafer (operation S310). In this regard, texturing may be performed on a surface of a semiconductor substrate. Texturing is a process of forming a textured surface with a plurality of protrusions by etching a front surface of a semiconductor substrate using a dry etching method such as reactive ion etching (RIE) or the like. Due to such texturing process, surface reflection loss may be reduced, light absorption may be increased by trapping of light, and loss of incident light may be minimized through diffuse reflection.

Subsequently, upper and lower emitter layers are formed by doping the textured semiconductor substrate with $POCl_3$ (operation S320). In this regard, to form a p-type emitter layer on an n-type substrate, $BBr_3$ that includes a Group III element is used. In contrast, to form an n-type emitter layer on a p-type substrate, gas such as $POCl_3$, $H_3PO_4$, or the like that includes a Group V element is used. In general, the n-type emitter may be formed by placing a wafer in a jig (quartz diffusion tube) inside a furnace with an appropriate temperature, i.e., 750° C. to 1000° C. and purging the tube with $POCl_3$ gas. In this process, the $POCl_3$ gas is diffused on the entire surface of the semiconductor substrate, i.e., outer surfaces thereof including a front surface, a rear surface, and side surfaces to form n-type emitter layers. Doping depth is approximately 500 nm.

Next, unwanted oxides including phosphorus that are generated when n-type impurities used in a doping process are diffused on a surface of a silicon substrate mainly used as a semiconductor substrate are removed using a phosphosilicate glass (PSG) process (operation S330).

Thereafter, a process of forming upper and lower antireflection coatings (ARCS) is performed (operation S340). An ARC is a thin film layer formed to reduce light reflection loss and is formed of a material that has a high bandgap and high electrical resistance so that a thin film itself does not absorb light, and that is highly resistant to moisture and corrosion, for example, $SiN_x$, $SiO_2$, $TiO_2$, or the like. The upper and lower ARCs may be formed by plasma enhanced chemical vapor deposition (PECVD).

Next, the upper ARC, the upper emitter layer, the semiconductor substrate, the lower emitter layer, and the lower ARC are sequentially etched to form a via hole penetrating the semiconductor substrate (operation S350).

Afterwards, sidewalls of the via hole are doped with boron (B) to form p+ type layers (operation S360).

Next, the upper and lower ARCs are partially etched to partially expose the upper and lower emitter layers. That is, emitter contact is opened (operation S370). Opening of emitter contact may be performed by, for example, photolithography.

Next, contact open regions and via hole contact are coated with a metal paste such as Al, Ag, AgAl, or the like using a metal screen-printing method to form upper and lower electrodes (emitter contact) and a contact electrode (via hole contact) (operation S380) and then a co-firing process is performed thereon. Metal printing is performed by screen-printing.

In another embodiment, Ti or Ni may first be deposited on contact open regions and via hole contact by atomic layer deposition (ALD) or using a sputter and then an Al or Ag paste process may be performed thereon. In this case, silicide of Ti or Ni is formed in a subsequent co-firing process and is referred to as Ti silicide or Ni silicide.

As is apparent from the above description, according to a solar cell according to the present invention and a method of manufacturing the same, front and rear surfaces of a semiconductor substrate have the same structure and thus the rear surface thereof also has shallow n-type and p-type regions that are separately operable, whereby problems of a conventional bifacial solar cell, i.e., lower photoelectric conversion efficiency at a rear surface thereof than at a front surface thereof, may be addressed.

In addition, an installation area of the solar cell may be minimized, and the solar cell is easily used for applications such as an anti-noise film and the like.

Although the preferred embodiments of the present invention have been described in the detailed description and the accompanying drawings for illustrative purposes, it will be apparent to those skilled in the art that various substitutions, modifications, and variations can be made in the present invention without departing from the spirit or scope of the invention. Thus, the embodiments should not be construed as limiting the scope of the present invention and the scope of the invention should be interpreted to include the appended claims and their equivalents.

What is claimed is:

1. A solar cell comprising:
   a semiconductor substrate doped with a first conductive type impurity through which a via hole passing from a first surface of the semiconductor substrate to a second surface thereof facing the first surface is formed, wherein the first surface is a light receiving surface;
   upper and lower emitter layers respectively formed on upper and lower surfaces of the semiconductor substrate and doped with a second conductive type impurity that is different from the first conductive type impurity;
   current collecting layers formed on sidewalls of the via hole and doped with a higher concentration of the first conductive type impurity than that of the semiconductor substrate;
   a contact electrode extending from the first surface of the semiconductor substrate to the second surface thereof so as to fill the via hole; and
   upper and lower electrodes respectively contacting the upper and lower emitter layers.

2. The solar cell according to claim 1, further comprising upper and lower anti-reflection coatings formed on the upper and lower emitter layers, respectively.

3. The solar cell according to claim 2, wherein the upper and lower anti-reflection coatings each comprise a plurality of layers with different indexes of refraction.

* * * * *